United States Patent
Chidambarrao et al.

(10) Patent No.: US 8,232,165 B2
(45) Date of Patent: Jul. 31, 2012

(54) FILM WRAPPED NFET NANOWIRE

(75) Inventors: Dureseti Chidambarrao, Hopewell Junction, NY (US); Lidija Sekaric, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/184,004

(22) Filed: Jul. 15, 2011

(65) Prior Publication Data

US 2011/0275198 A1 Nov. 10, 2011

Related U.S. Application Data

(62) Division of application No. 12/549,741, filed on Aug. 28, 2009, now abandoned.

(51) Int. Cl.
*H01L 21/336* (2006.01)

(52) U.S. Cl. ........ 438/257; 977/762; 977/814; 977/825; 977/936; 977/937; 977/938; 977/932; 257/9; 257/18; 257/19; 257/24; 257/38; 257/39; 257/E21.632; 438/149; 438/154; 438/199; 438/243; 438/283; 438/610; 438/612; 438/622

(58) Field of Classification Search ................ 257/9, 18, 257/19, 24, 38, 39, E21.632; 977/762, 814, 977/825, 932, 936–938; 438/149, 154, 199, 438/243, 257, 283, 610, 612, 622

See application file for complete search history.

(56) References Cited

U.S. PATENT DOCUMENTS

| | | |
|---|---|---|
| 6,720,240 B2 | 4/2004 | Gole et al. |
| 7,186,669 B2 | 3/2007 | Gole et al. |
| 7,358,160 B2 | 4/2008 | Li et al. |
| 2002/0129761 A1 | 9/2002 | Takami |
| 2003/0089899 A1 | 5/2003 | Lieber et al. |
| 2004/0112964 A1 | 6/2004 | Empedocles |
| 2005/0064185 A1 | 3/2005 | Buretea et al. |
| 2007/0176824 A1* | 8/2007 | Stumbo et al. ............... 342/372 |
| 2008/0135886 A1 | 6/2008 | Irisawa et al. |
| 2008/0149941 A1 | 6/2008 | Li et al. |

FOREIGN PATENT DOCUMENTS

| | | |
|---|---|---|
| WO | WO02080280 | 10/2002 |
| WO | WO2007005312 | 1/2007 |
| WO | WO2008034850 | 3/2008 |
| WO | 2008082186 A1 | 7/2008 |
| WO | WO2009107031 | 9/2009 |

OTHER PUBLICATIONS

Lauhon et al., Epitaxial core-shell and core-multishell nanowire heterostructures, Letters to Nature, Nov. 7, 2002, pp. 57-61, vol. 420, Harvard University, Cambridge, Massachusetts.

(Continued)

*Primary Examiner* — Meiya Li

(74) *Attorney, Agent, or Firm* — Cantor Colburn LLP; Vazken Alexanian

(57) ABSTRACT

A semiconductor structure includes an n-channel field effect transistor (NFET) nanowire, the NFET nanowire comprising a film wrapping around a core of the NFET nanowire, the film wrapping configured to provide tensile stress in the NFET nanowire. A method of making a semiconductor structure includes growing a film wrapping around a core of an n-channel field effect transistor (NFET) nanowire of the semiconductor structure, the film wrapping being configured to provide tensile stress in the NFET nanowire.

10 Claims, 10 Drawing Sheets

OTHER PUBLICATIONS

I. Goldthorpe et al., "Synthesis of Epitaxially-Aligned Ge/Si Core-Shell Nanowires," Symposium JJ: Nanowires—Novel Assembly Concepts and Device Integration; Nov. 26-28, 2007, JJ1.8, Materials Research Society.; pp. 1-79.

IBM Research, [online]; [retrieved on Jun. 25, 2009]; retreived from the Internet http://www.research.ibm.com/journal/rd/462/wong.txt; pp. 1-69.

PCT International Search Report, Sep. 29, 2010, YOR920100188US1, International Business Machines Corporation.

* cited by examiner

1000

DISPOSE GE LAYER ON SI LAYER
1001

THERMALLY MIX GE AND SI TO PRODUCE SIGE
1002

APPLY PHOTORESIST
1003

ETCH DOWN TO BURIED INSULATOR LAYER
1004

REMOVE PHOTORESIST AND ETCH BURIED INSULATOR LAYER TO PRODUCE SI PFET REGION AND SIGE NFET REGION
1005

THIN SI PFET REGION AND SIGE NFET REGION
1006

GROW SI WRAPPING
1007

FILM WRAPPED NFET NANOWIRE

CROSS-REFERENCE TO RELATED APPLICATION

This application is a divisional of prior application Ser. No. 12/549,741, filed Aug. 28, 2009.

FIELD OF INVENTION

This disclosure relates generally to the field of semiconductor structure, and specifically to inducing tensile stress in a nanostructure of a semiconductor structure.

DESCRIPTION OF RELATED ART

A semiconductor structure may comprise a number of field effect transistors (FETs); each FET may include a source, a drain, a channel, and a gate. The channel connects the source and the drain, and electrical current flows through the channel from the source to the drain. The electrical current flow is induced in the channel by a voltage applied at the gate. The size of a FET is related to the electrical conductivity of the material that comprises the channel. If the material that comprises the channel has a relatively high conductivity, the FET may be made correspondingly smaller.

A FET may comprise an n-channel field effect transistor (NFET) or a p-channel field effect transistor (PFET). The electrical conductivity of an NFET is determined by the electron mobility of the NFET channel. In some semiconductor materials, the electron mobility of the NFET channel is related to the amount of tensile stress in the NFET material; more specifically, increased tensile stress in the NFET material may raise the electron mobility of some NFET materials.

In a relatively small FET, a channel may comprise a nanostructure, also referred to as a nanowire. An exemplary nanowire may have a cross-sectional area of about 20 nanometers (nm) by 20 nm or less. Due to the small size and freestanding nature of a nanowire, inducing tensile stress in a nanowire may present difficulties.

SUMMARY

In one aspect, a semiconductor structure includes an n-channel field effect transistor (NFET) nanowire, the NFET nanowire comprising a film wrapping around a core of the NFET nanowire, the film wrapping configured to provide tensile stress in the NFET nanowire.

In one aspect, a method of making a semiconductor structure includes growing a film wrapping around a core of an n-channel field effect transistor (NFET) nanowire of the semiconductor structure, the film wrapping being configured to provide tensile stress in the NFET nanowire.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a wrapped NFET nanowire are provided, with exemplary embodiments being discussed below in detail.

A film wrapping on an NFET nanowire may enhance tensile stress in the NFET nanowire, enhancing the electron mobility in the NFET nanowire. In an exemplary embodiment, wrapping silicon (Si) around a silicon germanium (SiGe) core may provide tensile stress in an NFET nanowire.

For an example SiGe core with a cross section that comprises a square with a side length of 5 nanometers (nm), the cross-sectional area of the SiGe core is 25 $nm^2$. The SiGe core is relaxed (i.e., has minimal stress) because it is freestanding. A silicon film wrapping that conforms to the SiGe core potentially causes a tensile stress in the Si of about 1.75 gigapascals (GPa). This tensile stress may increase the electron mobility of the overall nanowire, which comprises the SiGe core and the Si film wrapping.

Figure 1:
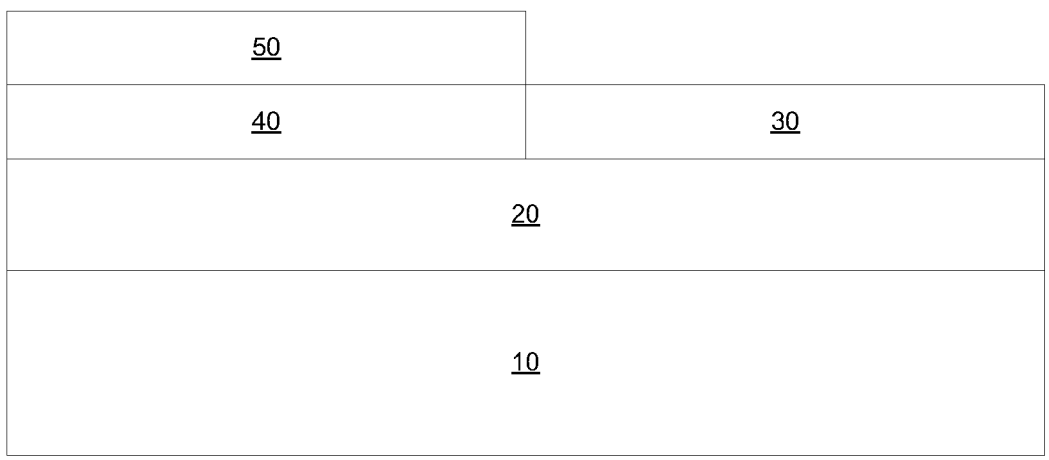
FIG. 1 illustrates an embodiment of a cross-section of a semiconductor structure after application of a layer of germanium (Ge).

FIG. 1 illustrates an embodiment of a cross-section of a semiconductor structure after application of a layer 50 of Ge. Layer 10 comprises a substrate, which may comprise silicon in some embodiments. Layer 20 comprises buried insulator, which may comprise a dielectric material such as oxide in some embodiments. Layer 50 comprises Ge, and is disposed on Si layer 40. Layer 30 comprises Si.

Figure 2:
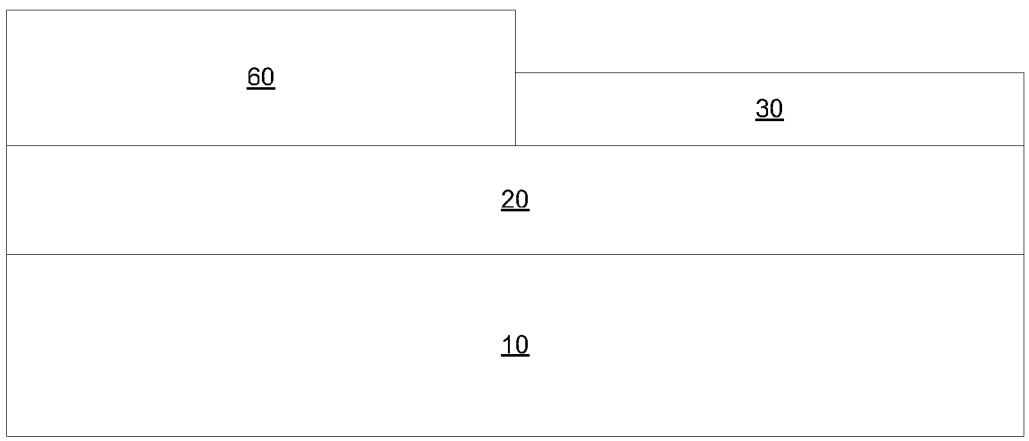
FIG. 2 illustrates an embodiment of a cross-section of a semiconductor structure after thermal mixing of silicon (Si) and Ge layers.

FIG. 2 illustrates an embodiment of a cross-section of a semiconductor structure after thermal mixing of Si layer 40 and Ge layer 50. Layers 40 and 50 of FIG. 1 have been thermally mixed, resulting in SiGe layer 60. Layer 30 comprises Si, layer 20 comprises buried insulator, and layer 10 comprises substrate. In some embodiments, SiGe layer 60 may be thinned, or Si layer 30 may be thickened, as necessary in order to achieve appropriate dimensions for layers 30 and 60.

Figure 3:
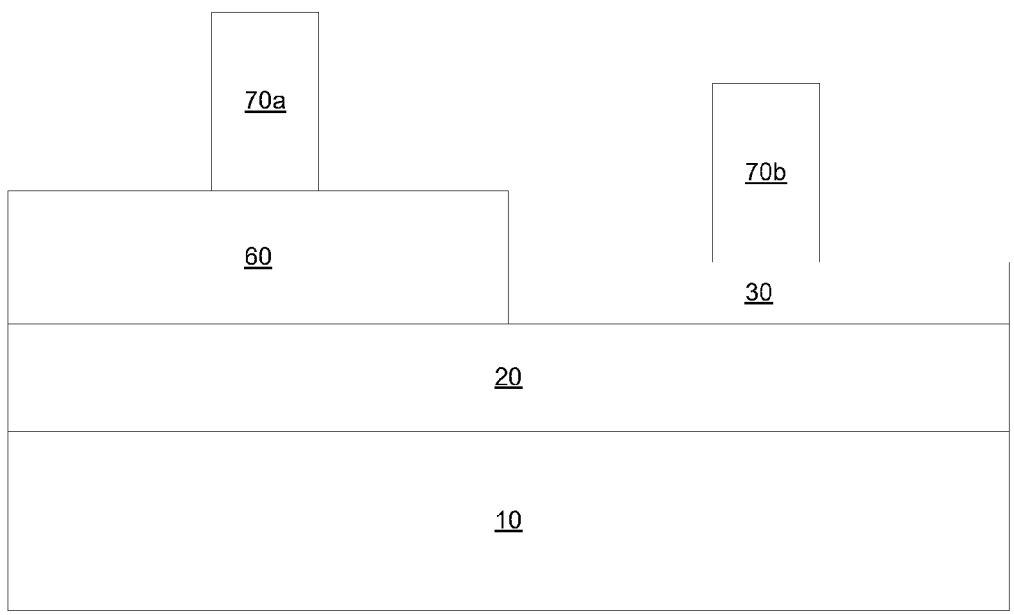
FIG. 3 illustrates an embodiment of a cross-section of a semiconductor structure after application of photoresist.

FIG. 3 illustrates an embodiment of a cross-section of a semiconductor structure after application of photoresist. Photoresist layers 70a and 70b are placed on SiGe layer 60 and Si layer 30, respectively, to define nanowire regions. Layer 20 comprises buried insulator, and layer 10 comprises substrate.

Figure 4:
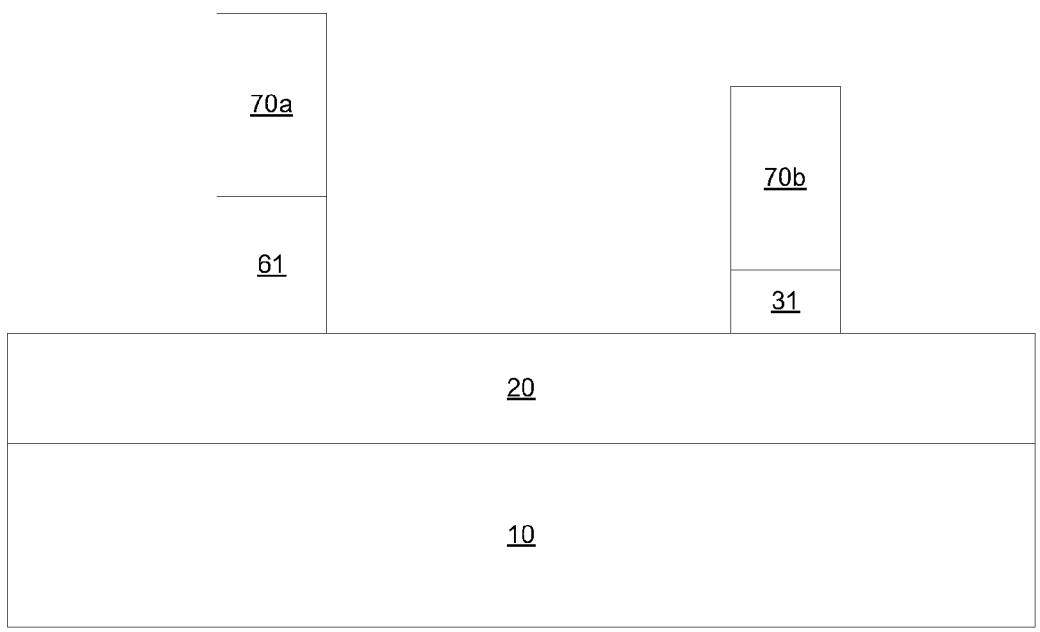
FIG. 4 illustrates an embodiment of a cross-section of a semiconductor structure after initial formation of the nanowire regions.

FIG. 4 illustrates an embodiment of a cross-section of a semiconductor structure after initial formation of PFET and NFET regions. The SiGe layer 60 and Si layer 30 have been etched down to buried insulator layer 20, leaving SiGe NFET region 61 under photoresist layer 70a, and Si PFET region 31 under photoresist layer 70b. Layer 10 comprises substrate.

Figure 5:
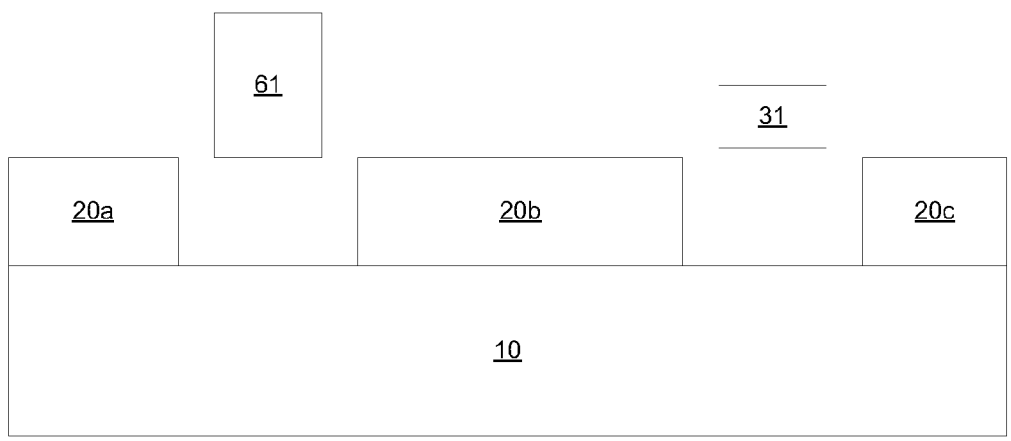
FIG. 5 illustrates an embodiment of a cross-section of a semiconductor structure after removal of the photoresist and etching of the buried insulator layer.

FIG. 5 illustrates an embodiment of a cross-section of a semiconductor structure after removal of the photoresist and etching of the buried insulator layer. The photoresist layers 70a and 70b have been etched off, along with a portion of buried insulator layer 20, resulting in freestanding SiGe NFET region 61, freestanding Si PFET region 31, and buried insulator layers 20a, 20b, and 20c. Layer 10 comprises substrate. NFET region 61 and PFET region 31 are tethered to silicon pads 901 and 903, as discussed below with regards to FIG. 9.

Figure 6:
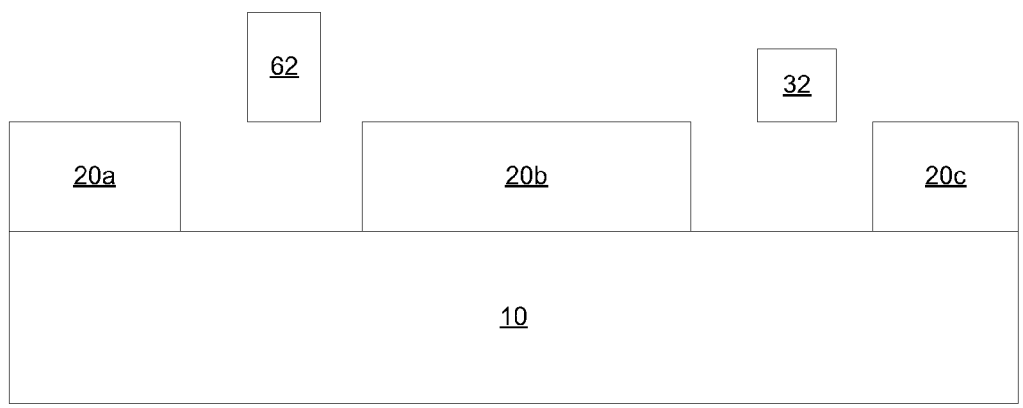
FIG. 6 illustrates an embodiment of a cross-section of a semiconductor structure after oxide thinning.

FIG. 6 illustrates an embodiment of a cross-section of a semiconductor structure after oxide thinning Oxide thinning is performed on SiGe NFET region 61 and Si PFET region 31, resulting in SiGe core 62 and Si wire 32. SiGe core 62 and Si wire 32 may each have a cross-sectional area of about 20 nm by about 20 nm or less. Layers 20a, 20b, and 20c comprise buried insulator, and layer 10 comprises substrate.

Figure 7:
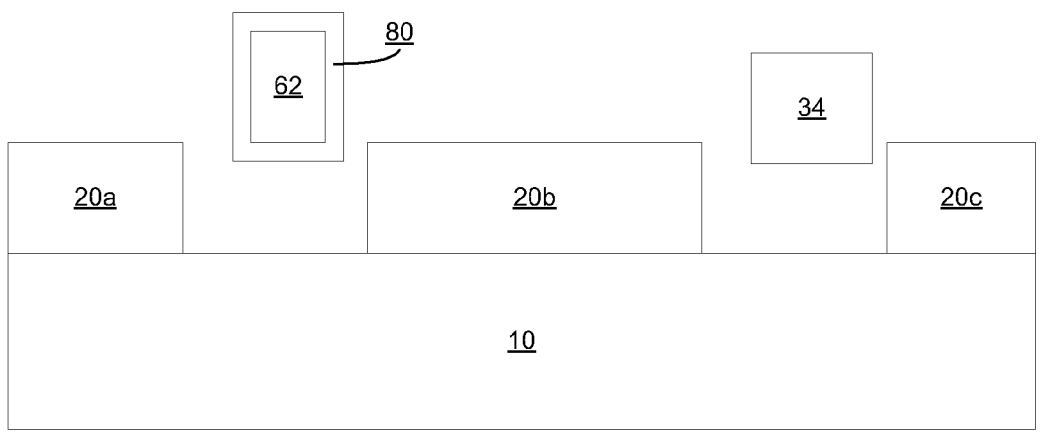
FIG. 7 illustrates an embodiment of a cross-section of a semiconductor structure after formation of a Si wrapping on the SiGe wire wherein the PFET Si wire is thickened

FIG. 7 illustrates an embodiment of a cross-section of a semiconductor structure after formation of a Si film wrapping 80 on SiGe core 62 and thickening of Si wire 32, resulting in thickened Si PFET nanowire 34. Layers 20a, 20b, and 20c comprise buried insulator, and layer 10 comprises substrate. Si film wrapping 80 provides tensile stress in the NFET; together, Si film wrapping 80 and SiGe core 62 form an NFET nanowire. Si film wrapping 80 may have a thickness between about 1 and 2 nm.

Figure 8:
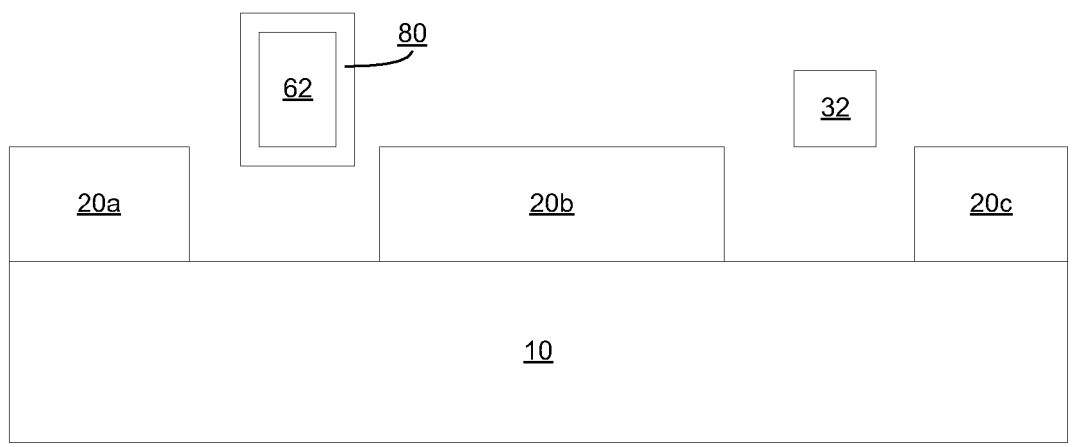
FIG. 8 illustrates an embodiment of a cross-section of a semiconductor structure after formation of a Si wrapping on the SiGe wire wherein the PFET Si wire is not thickened.

FIG. 8 illustrates an embodiment of a cross-section of a semiconductor structure after formation of a Si film wrapping 80 on SiGe core 62 in which Si wire 32 is not thickened. The Si PFET wire 32 of FIG. 6 is masked, and Si film wrapping 80 is grown on SiGe NFET wire 62. Layers 20a, 20b, and 20c comprise buried insulator, and layer 10 comprises substrate. Si film wrapping 80 provides tensile stress in the NFET; together, Si film wrapping 80 and SiGe core 62 form an NFET nanowire. Si wire 32 comprises a PFET nanowire. Si film wrapping 80 may have a thickness between about 1 and 2 nm.

Figure 9:
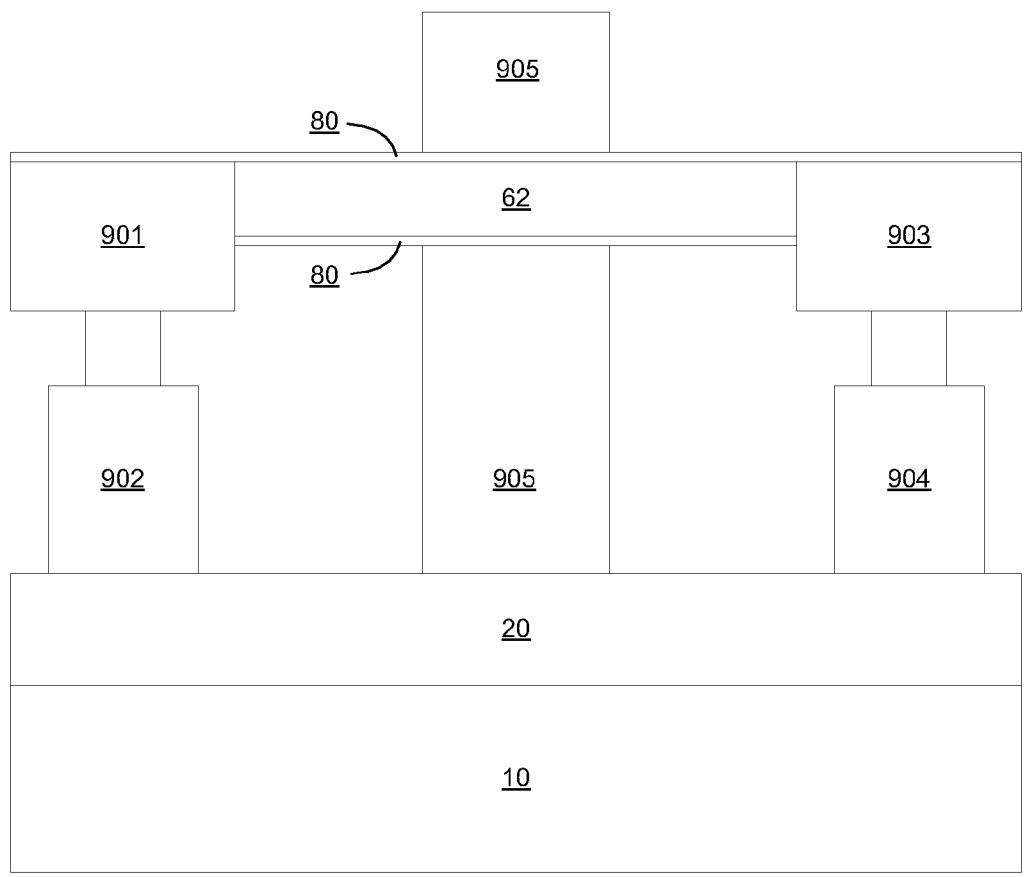
FIG. 9 illustrates an embodiment of a side view of a semiconductor structure comprising a wrapped NFET nanowire.

FIG. 9 illustrates a side view of an embodiment of a semiconductor structure comprising a wrapped NFET nanowire. SiGe core 62 is surrounded by Si wrapping 80, together forming an NFET nanowire. Film wrapping 80 provides tensile stress in the NFET nanowire. Pad 901 and pedestal 902 are on the source side of the semiconductor structure, and pad 903 and pedestal 904 are on the drain side of the semiconductor structure. Electrical current flows through SiGe core 62 and Si film wrapping 80 from source-side pad 901 to drain-side pad 903 according to a voltage applied at gate 905. Layer 20 comprises buried insulator, and layer 10 comprises substrate.

Figure 10:
FIG. 10 illustrates an embodiment of a method for a process of making a semiconductor structure comprising a wrapped NFET nanowire.
Figure 10:
Figure 10:
Figure 10:
Figure 10:
Figure 10:

FIG. 10 illustrates a method 1000 for a process of making a semiconductor structure comprising a film wrapped NFET nanowire. In block 1001, a germanium layer is disposed on a portion of an exposed silicon layer, as is shown in FIG. 1. In block 1002, the germanium layer and the silicon layer are thermally mixed, resulting in an exposed SiGe layer and an exposed Si layer, as is shown in FIG. 2. In block 1003, a layer of photoresist is applied to a portion of the SiGe layer, and a layer of photoresist is applied to the Si layer, as is shown in FIG. 3. In block 1004, the exposed SiGe and Si layers are etched down to a buried insulator layer, leaving the portions of the SiGe and the Si located under the photoresist layers, as is shown in FIG. 4. In block 1005, the photoresist is removed, and the buried insulator is etched, resulting in a freestanding SiGe NFET region and a freestanding Si PFET region, as is shown in FIG. 5. In block 1006, the freestanding SiGe NFET region and the freestanding Si PFET region are thinned, resulting in a SiGe NFET core and a Si PFET wire, as is shown in FIG. 6. In block 1007, a Si film wrapping is grown. In some embodiments, the Si PFET wire is masked, and the Si film wrapping is grown on the SiGe core, forming the NFET nanowire, as is shown in FIG. 8. In other embodiments, the Si PFET wire is not masked, and Si is also grown on the Si PFET wire, resulting in a thickened Si PFET nanowire, as is shown in FIG. 7. The Si film wrapping provides tensile stress in the NFET nanowire, resulting in enhanced electrical conductivity in the NFET nanowire.

The technical effects and benefits of exemplary embodiments include increased tensile stress in an NFET nanowire, thereby increasing the electrical conductivity of the nanowire and allowing for reduction in size of a semiconductor device.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of making a semiconductor structure, the method comprising:
   forming a core of an n-channel field effect transistor (NFET) nanowire, wherein forming the core of the NFET nanowire comprises:
      forming a germanium layer on a first portion of a silicon layer of the semiconductor structure;
      thermally mixing the germanium layer and the first portion of the silicon layer to form a silicon germanium layer; and
      etching the silicon germanium layer to form the core of the NFET nanowire; and
   growing a film wrapping around the core of the NFET nanowire of the semiconductor structure, the film wrapping being configured to provide tensile stress in the NFET nanowire.

2. The method of claim 1, further comprising masking a p-channel field effect transistor (PFET) nanowire of the semiconductor structure while growing the film wrapping.

3. The method of claim 2, wherein the PFET nanowire comprises silicon (Si).

4. The method of claim 1, wherein the NFET nanowire core comprises silicon germanium (SiGe).

5. The method of claim 1, wherein the NFET nanowire has a cross-sectional area of about 20 nanometers (nm) by about 20 nanometers or less.

6. The method of claim 1, wherein the film wrapping comprises silicon (Si).

7. The method of claim 1, wherein the film wrapping has a thickness between about 1 nanometer (nm) and 2 nm.

8. The method of claim 1, further comprising thickening a p-channel field effect transistor (PFET) nanowire of the semiconductor structure while growing the film wrapping.

9. The method of claim 1, further comprising etching a second portion of the silicon layer of the semiconductor structure to form a PFET nanowire simultaneously with etching the silicon germanium layer to form the core of the NFET nanowire.

10. The method of claim 9, further comprising thinning the core of the NFET nanowire and the PFET nanowire after etching.

* * * * *